(12) United States Patent
Ganesh

(10) Patent No.: US 8,890,538 B2
(45) Date of Patent: Nov. 18, 2014

(54) SENSING SYSTEM AND METHOD FOR MANUFACTURING THE SAME

(75) Inventor: Meena Ganesh, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 913 days.

(21) Appl. No.: 13/023,944

(22) Filed: Feb. 9, 2011

(65) Prior Publication Data

US 2012/0200301 A1    Aug. 9, 2012

(51) Int. Cl.
*G01R 31/02* (2006.01)

(52) U.S. Cl.
USPC .......................................... 324/537; 324/508

(58) Field of Classification Search
CPC ...................................... G01R 15/148
USPC ......................................... 324/537
See application file for complete search history.

(56) References Cited

U.S. PATENT DOCUMENTS

| | | | |
|---|---|---|---|
| 4,794,327 A | 12/1988 | Fernandes | |
| 5,426,360 A * | 6/1995 | Maraio et al. | 324/126 |
| 5,744,967 A | 4/1998 | Sorensen | |
| 5,852,796 A | 12/1998 | Stepanenko, Jr. | |
| 6,230,109 B1 | 5/2001 | Miskimins et al. | |
| 6,687,639 B2 | 2/2004 | Taniguchi et al. | |
| 7,512,503 B2 | 3/2009 | Bechhoefer et al. | |
| 7,696,760 B2 | 4/2010 | Lindsey et al. | |
| 2002/0074475 A1 * | 6/2002 | Nordvik | 248/542 |
| 2002/0147561 A1 | 10/2002 | Baracat et al. | |
| 2005/0134290 A1 * | 6/2005 | Sarkozi et al. | 324/543 |
| 2006/0076946 A1 | 4/2006 | Shvach et al. | |
| 2008/0231289 A1 * | 9/2008 | Ganesh et al. | 324/539 |
| 2010/0013457 A1 | 1/2010 | Nero | |
| 2010/0037110 A1 | 2/2010 | Oruganty | |
| 2011/0043219 A1 * | 2/2011 | Ganesh et al. | 324/543 |

FOREIGN PATENT DOCUMENTS

WO        0208771 A1    1/2002

OTHER PUBLICATIONS

Future Electronics, What is an Embedded Processor?, p. 1-2 http://www.futureelectronics.com/en/microprocessors/embedded-processors.aspx.*
Thinkquest, Processors, p. 1-6, http://library.thinkquest.org/25111/processor.shtml.*
McGraw-Hill, Introduction to Embedded Systems, Chapter 1, p. 1-49, http://highered.mcgraw-hill.com/sites/dl/free/007340456x/167481/sample1.pdf.*

(Continued)

*Primary Examiner* — Thomas F Valone
(74) *Attorney, Agent, or Firm* — Scott J. Asmus

(57) ABSTRACT

A system includes a sensor housing having a base portion, a lid portion, and a joining portion. The joining portion is configured to be wrapped around at least a portion of an electrical wire. The lid portion includes one end detachably coupled to a first end of the base portion and another end coupled to a second end of the base portion via the joining portion. A flexible coil sensor is disposed in the sensor housing; bonded substantially along the base portion and the joining portion and configured to generate a signal representative of a fault in the electrical wire. A processing device is disposed in the sensor housing and configured to detect and locate a fault in the electrical wire in response to the signal representative of the fault in the electrical wire generated by the flexible coil sensor.

20 Claims, 4 Drawing Sheets

(56) References Cited

OTHER PUBLICATIONS

Logic PD, Press Release, Logic PD unveils the industry's smallest embedded modules, p. 1-2, May 3, 2011, http://www.logicpd.com/_archived_drupal_site/news/press-releases/logic-pd-unveils-industrys-smallest-embedded-modules.*

ThinkQuest Library Archive, Processors, p. 1-6, http://wayback.archive-it.org/3635/20130830103930/http://library.thinkquest.org/25111/processor.shtml, Aug. 30, 2013.*

Future Electronics, What is an Embedded Processor?, p. 1-2 http://www.futureelectronics.com/en/microprocessors/embedded-U processors.aspx, no date.*

McGraw-Hill, Introduction to Embedded Systems, Chapter 1, p. 1-49, http://highered.mcgraw-hill.com/sites/dl/free/007340456x/167481/sample 1 .pdf, no date.*

Search Report and Written Opinion from corresponding EP Application No. 12154560.2-2216 dated Jun. 27, 2012.

* cited by examiner

SENSING SYSTEM AND METHOD FOR MANUFACTURING THE SAME

STATEMENT REGARDING FEDERALLY SPONSORED RESEARCH & DEVELOPMENT

This invention was made with Government support under contract number N00421-05-D-0116-0004 awarded by NAVAIR. The Government has certain rights in the invention.

BACKGROUND

Embodiments presented herein relate generally to sensing systems, and more particularly, to a sensing system for detecting fault in a wire harness, for example aircraft wire harness.

Wiring systems may be used in a variety of industries, such as the aviation industry. Different devices and components may be controlled, monitored and/or enabled using the wiring systems. The wiring system usually includes one or more wire harnesses that enable the establishment of electrical power between the various systems. Non-limiting examples of wire harnesses include electrical conductors and connectors. These wire harnesses may be configured to pass various types of electrical signals, including DC voltage and AC voltage signals.

The integrity of the high voltage harness is important to the reliability of the wiring systems. For instance, if the connector components are not fully engaged or properly soldered, or crimped, or other types of connector faults occur, arcs may occur at the connector. Arcs usually contain high energy and generate a large amount of heat that may melt the connector and any conductive components. Arc may also be generated due to defects in insulation in the wiring systems. Arc may also be generated in the wire itself. Therefore, it is desirable to test the harness system and detect connector degradation before arcs occur.

One existing technique is detection of problems through visual inspections, for example, as in connection with general procedures and inspections of aircraft wiring systems. However, defects may go undetected and may only be detected after a system failure or after a more noticeable amount of damage has occurred. In another existing technique, a sensing system is used for detection of fault in the wiring system. For example, in the aviation industry, the sensing system is linked to a health and usage monitoring system (processor) located at the ground level. Linking the health and usage monitoring system to the actual sensor inside the aircraft is complex and prone to errors especially if the sensors were moved. Moreover the entire diagnostic system is bulky.

There is therefore a need for an improved sensing system.

BRIEF DESCRIPTION

In accordance with one example embodiment, a system includes a sensor housing having a base portion, a lid portion, and a joining portion. The joining portion is configured to be wrapped around at least a portion of an electrical wire. The lid portion includes one end detachably coupled to a first end of the base portion and another end coupled to a second end of the base portion via the joining portion. A flexible coil sensor is disposed in the sensor housing; bonded substantially along the base portion and the joining portion and configured to generate a signal representative of a fault in the electrical wire. A processing device is disposed in the sensor housing and configured to detect the fault in the electrical wire in response to the signal representative of the fault in the electrical wire generated by the flexible coil sensor.

In accordance with another example embodiment, a system includes a plurality of sensing systems spaced apart and configured to receive an electrical wire. Each sensing system includes a sensor housing, a flexible coil sensor, and a processing device. A sensor housing includes a base portion, a lid portion; and a joining portion. The joining portion is configured to be wrapped around at least a portion of the electrical wire. The lid portion includes one end detachably coupled to a first end of the base portion and another end coupled to a second end of the base portion via the joining portion. A flexible coil sensor is disposed in the sensor housing; bonded substantially along the base portion and the joining portion and configured to generate a signal representative of a fault in the electrical wire. A processing device is disposed in the sensor housing and configured to detect the fault in the electrical wire in response to the signal representative of the fault in the electrical wire generated by the flexible coil sensor. Two sensing systems among the plurality of sensing systems are configured to detect a fault location in the electrical wire between two sensing systems.

In accordance with another example embodiment, a related method is disclosed. The method includes forming a sensor housing by detachably coupling one end of a lid portion to a first end of a base portion and another end of the lid portion to a second end of the base portion via a joining portion. The method further includes disposing a flexible coil sensor in the sensor housing by bonding substantially along the base portion and the joining portion. The method also includes disposing a processing device in the sensor housing in such a way so as to sense a signal from the flexible coil sensor. The joining portion is wrapped around at least a portion of the electrical wire.

DRAWINGS

The following detailed description should be read with reference to the accompanying drawings in which like characters represent like parts throughout the drawings, wherein.

DETAILED DESCRIPTION

In accordance with certain embodiments presented herein, a sensing system is disclosed. The sensing system includes a flexible coil sensor disposed in the sensor housing. The flexible coil sensor is bonded substantially along a base portion and a joining portion of the sensor housing and configured to generate a signal representative of a fault in the electrical wire. A processing device is disposed in the sensor housing and configured to detect the fault in the electrical wire in response to the signal representative of the fault in the electrical wire generated by the flexible coil sensor. In accordance with a particular embodiment, a diagnostic system incorporating a plurality of the exemplary sensing system is disclosed. In accordance with another exemplary embodiment, a method for manufacturing the sensing system is disclosed. As discussed herein, the processing device is easily fitted inside the sensor housing.

Figure 1:
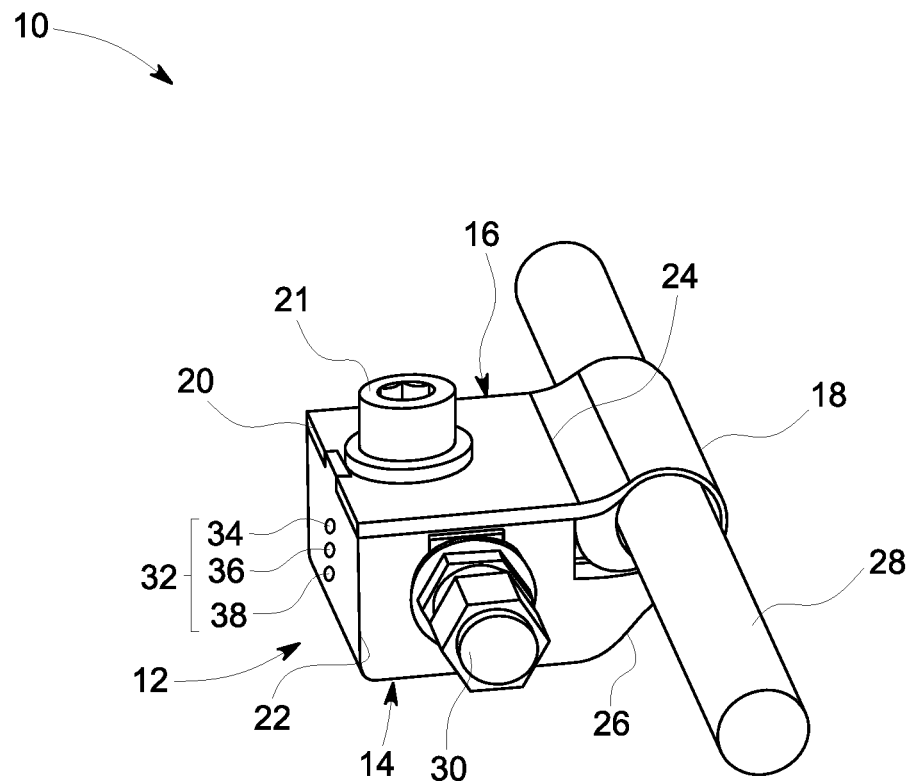
FIG. 1 is a perspective view of a sensing system in a closed state configured to detect fault in an electrical wire or a wire harness in accordance with an exemplary embodiment.
Figure 2:
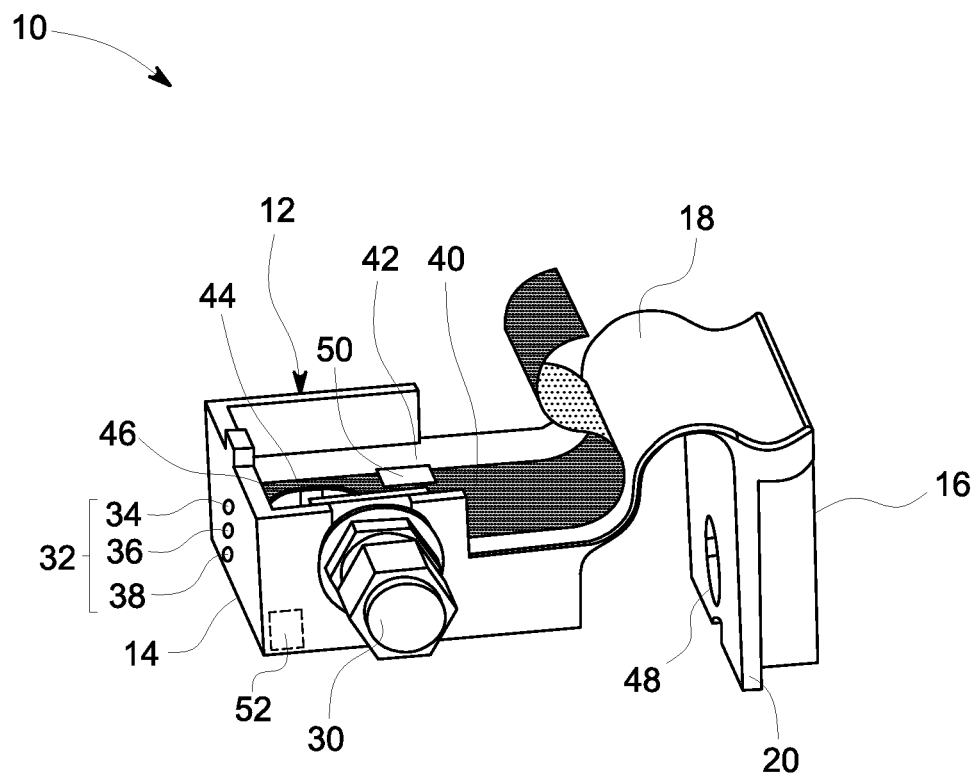
FIG. 2 is a perspective view of a sensing system in an opened state configured to detect fault in an electrical wire or a wire harness in accordance with an exemplary embodiment.

Referring to FIGS. 1 and 2, therein is illustrated a sensing system 10 in accordance with an embodiment. The sensing system 10 can include a flexible coil sensor 40 disposed inside a sensor housing 12. The sensor housing 12 can include a base portion 14, a lid portion 16 and a joining portion 18. In certain embodiments, the lid portion 16 and the base portion 14 have a cuboidal structure. In such embodiments, the joining portion 18 may have a semicircular structure. One end 20 of the lid portion 16 can be detachably coupled to a first end 22 of the base portion 14 via a nut and screw joint 21. Another end 24 of the lid portion 16 can be coupled to a second end 26 of the base portion 14 via the joining portion 18. In one embodiment, the sensor housing 12 is a single piece structure. In another embodiment, the base portion 14, the lid portion 16, and the joining portion 18 are manufactured separately and thereafter coupled together in a manner described above.

The sensor housing 12 of the sensing system 10 can be configured to receive an electrical wire or bundle of electrical wires (wire harness) 28 to be monitored for faults by the sensing system 10. The term 'faults', as used herein, includes electrical discharges in the electrical wire or wires 28 due to reasons such as, for example, a failure in insulation in the electrical wires 28, improper installation, improper handling, and external factors such as temperature and humidity. In the illustrated embodiment, the joining portion 18 is wrapped around at least a portion of the electrical wires 28. As discussed in more detail below, the flexible coil sensor 40 disposed inside the sensor housing 10 can be configured to generate a signal representative of a fault in the electrical wires 28. A connector 30 can be coupled to the base portion 14 and also to the flexible coil sensor 40.

A processing device 50 can be disposed in the sensor housing 12 and configured to detect the fault in the electrical wires 28 in response to the signal representative of the fault in the electrical wires 28 generated by the flexible coil sensor 40. In the illustrated embodiment, an output device 32 is provided to the sensor housing 12 and configured to generate an output indicative of presence of the fault in the electrical wires 28. The illustrated output device 32 can include a plurality of light emitting diodes 34, 36, 38.

FIG. 2 illustrates the sensing system 10 having the sensor housing 12 in an open position in accordance with an embodiment of FIG. 1. A flexible coil sensor 40 can be disposed in the sensor housing 12. In the illustrated embodiment, the flexible coil sensor 40 is bonded substantially along a flat surface 42 of the base portion 14, and along the joining portion 18 using, say, an adhesive. In certain embodiments, the flexible coil sensor 40 can also be bonded to at least a portion of the lid portion 16.

In reference to both FIGS. 1 and 2, the flexible coil sensor 40, the base portion 14, and the lid portion 16 can include an opening 44, an opening 46, and an opening 48, respectively. When the sensor housing 12 is in a closed position as illustrated in FIG. 1, the opening 46, the opening 48, and the opening 49 can overlap with each other and enable fitting of the nut and screw joint 21. The one end 20 of the lid portion 16 can be detachably coupled to the base portion 14 using the nut and screw joint 21 in such a way that the lid portion 16 overlaps the base portion 14 and the flexible coil sensor 40 can be surrounded by the lid portion 16, the joining portion 18, and the base portion 14. Further, as the flexible coil sensor 40 may be bonded to the joining portion 18 in such a way that the flexible coil sensor 40 extends at least partially around the electrical wires 28 when the sensor housing 12 is in a closed position as illustrated in FIG. 1, the joining portion 18 being similarly wrapped around at least a portion of the electrical wires 28.

A processing device 50 can be disposed in the sensor housing 12. As discussed previously, the processing device 50 may be configured to detect the fault in the electrical wires 28 in response to the signal representative of the fault in the electrical wires 28 generated by the flexible coil sensor 40. For example, when an electric discharge or other fault occurs in the electrical wires 28, the resulting magnetic fields induce an electrical signal in the flexible coil sensor 40. The electrical signal can be transmitted to the processing device 50. The processing device 50 can be configured to analyze the signal to detect the occurrence of fault in the electrical wires 28. The processing device 50 can be, for example, a processing chip device. Although in the illustrated embodiment, the processing device 50 is disposed above the flexible coil sensor 40, in another embodiment, the processing device 50 is disposed below the flexible coil sensor 40 in the sensor housing 12. Other suitable locations of the processing device 50 within the sensor housing 12 are also envisaged, with the processing device 50 generally being disposed in close proximity to the coil sensor 40 so as to communicate directly with the coil sensor 40.

As discussed previously, the output device 32 is provided to the sensor housing 12 and includes, for example, three light emitting diodes 34, 36, 38. The light emitting diodes 34, 36, 38 can be configured to generate an output indicative of presence of the fault in the electrical wires 28. The processing device 50 can be coupled to the output device 32 and configured to actuate the output device 32 in response to the signal representative of the fault in the electrical wires generated by the flexible coil sensor 40. In a specific embodiment, the diodes 34, 36, 38 include a red diode, green diode, and yellow diode respectively. Actuation of the red diode may be indicative of the presence of a severe fault in the electrical wires. Actuation of green diode may be indicative of the absence of the fault in the electrical wires. Actuation of yellow diode may be indicative of imminent fault in the electrical wires. The type of output device and the number may vary depending on the application. In a specific embodiment, the sensing system 10 is powered by a battery 52 embedded in the sensor housing 12.

Sensing systems consistent with the above description, including the exemplary sensing system 10, may be useful, especially for aviation systems. In conventional sensing systems used for aviation applications, sensors may be associated with bulky and complex processing systems located at a ground level separately from the sensor. Linking processing systems located at the ground to sensors provided inside the aircraft may require lot of effort. Further, the system can be prone to errors, especially if the sensors were moved. In accordance with the embodiments discussed herein, the sensing system 10 may be compact and lightweight, for example, where the processing device 50 is a chip that is, say, fitted in the sensor housing 12. Moreover, due to the relative proximity of the sensor 40 and the processing device 50, the signal attenuation may be reduced and the detection accuracy enhanced.

Figure 3:
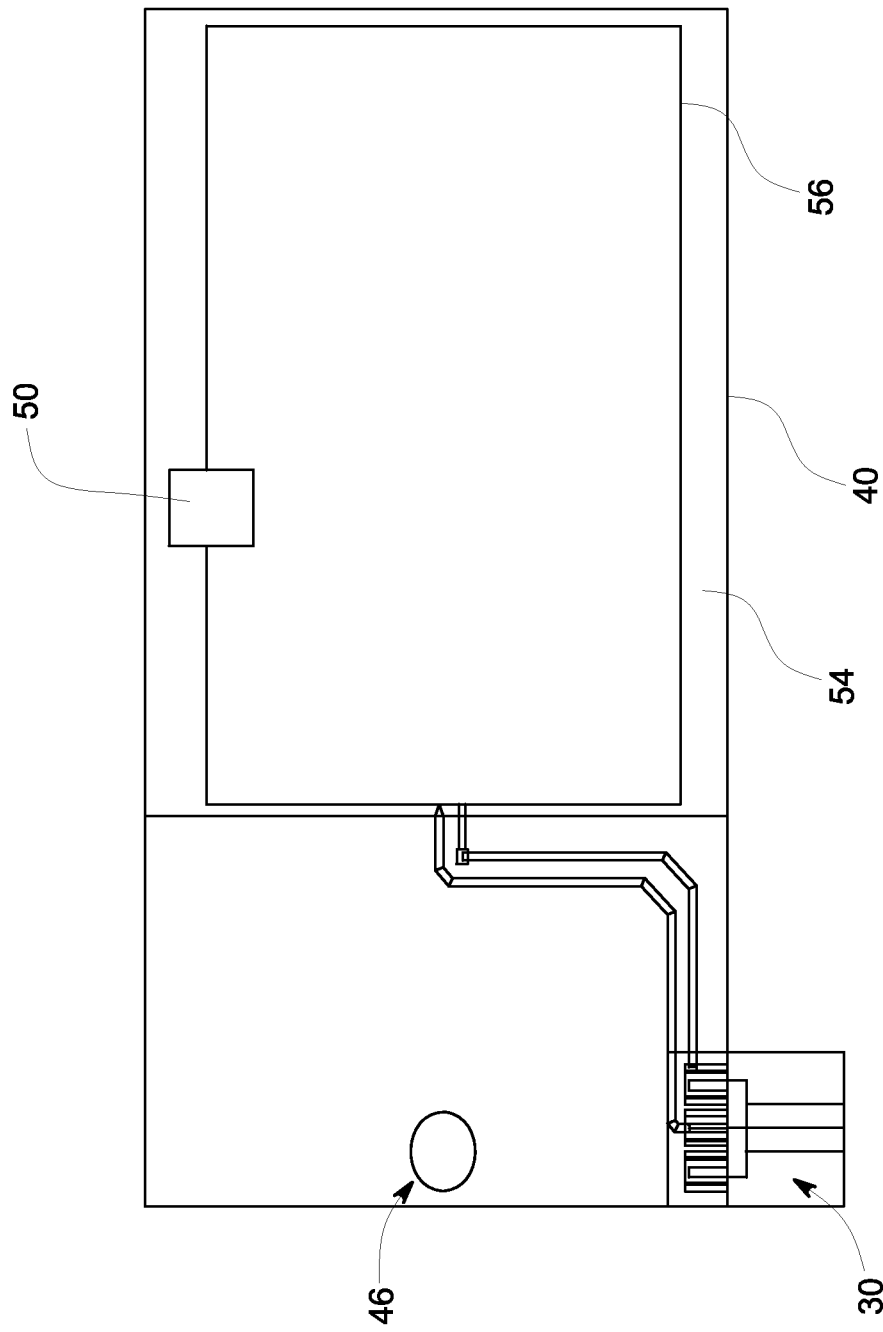
FIG. 3 is a diagrammatical representation of a sensing system in accordance with an exemplary embodiment.

FIG. 3 illustrates the flexible coil sensor 40 coupled to the connector 30 in accordance with an embodiment. The flexible coil sensor 40 can include a substrate 54 having a coil shaped pattern 56 etched on the substrate 54. The substrate 54 can include the opening 46 as discussed in conjunction with FIGS. 1 and 2. In reference to both FIGS. 1 and 3, when an electric discharge or other fault occurs in the electrical wires, the resulting magnetic fields induce an electrical signal in the flexible coil sensor 40. The electrical signal is transmitted to the processing device 50 disposed in the sensor housing, which analyzes the electrical signal to identify the occurrence of fault in the electrical wires.

Figure 4:
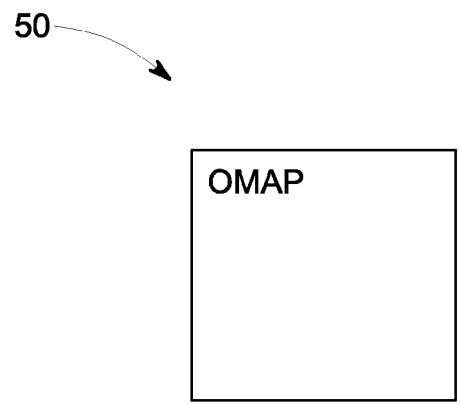
FIG. 4 is a diagrammatical representation of a processing device in a sensing system in accordance with an exemplary embodiment.

FIG. 4 is a diagrammatical representation of the processing device 50. As discussed previously, the processing device 50 may be a processing chip device. In certain embodiments, the processing device 50 includes an embedded processing chip. In one embodiment, the embedded processing chip is an open multimedia application platform (OMAP processor). In one embodiment, the processing device 50 has a length in the range of 0.5 inch to 1 inch and a breadth in the range of 0.5 inch to 1 inch. In another embodiment, the processing device 50 length of 0.5 inch and a breadth of 0.5 inch. The compactness of the exemplary processing device 50 facilitates easy fitting within the sensor housing. Since the processing device 50 is a chip, the device 50 can be located at any convenient location in the sensor housing. Since the processing device 50 is a chip, the device 50 can be located at any location within the sensor housing.

Figure 5:
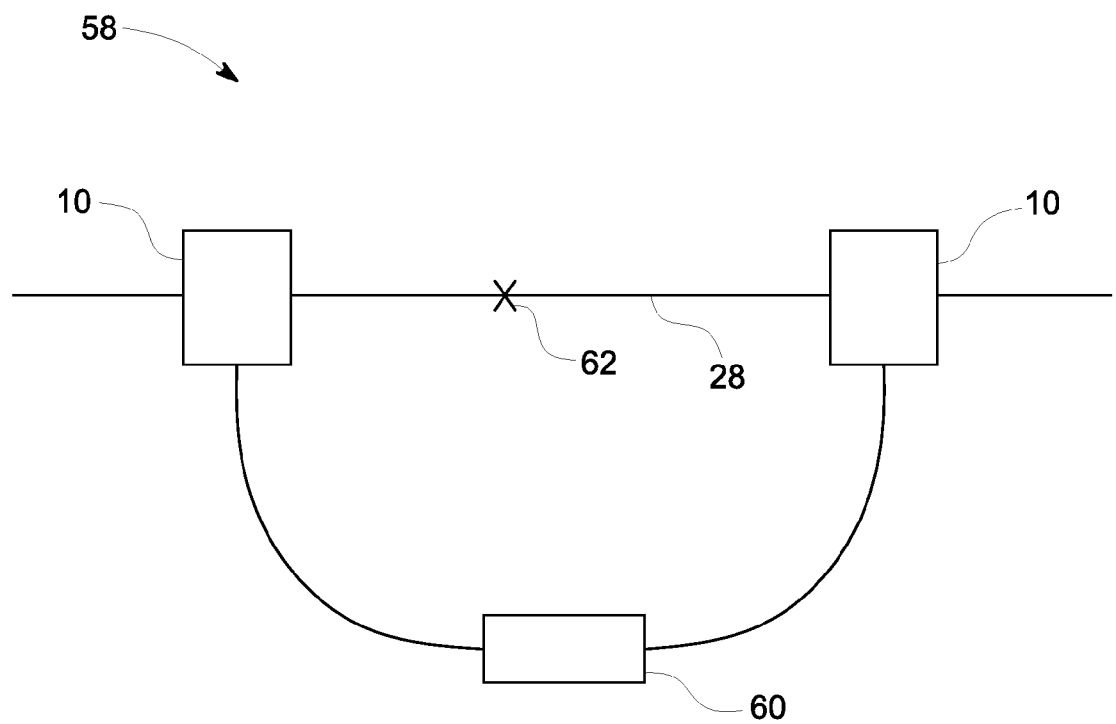
FIG. 5 is a diagrammatical representation of a diagnostic system having a plurality of sensing systems in accordance with an exemplary embodiment.

FIG. 5 is a diagrammatical representation of a diagnostic system 58 in accordance with an example embodiment. The diagnostic system 58 includes a plurality of sensing systems 10 (two sensing systems 10 are illustrated). As discussed previously with reference to FIGS. 1-4, each example sensing system 10 includes the flexible coil sensor disposed in the sensor housing. The flexible coil sensor can be configured to generate a signal representative of a fault in the electrical wires 28. The processing device can be disposed in the sensor housing and configured to detect the fault in the electrical wire in response to the signal representative of the fault in the electrical wires 28 generated by the flexible coil sensor.

In the illustrated embodiment, the sensing systems 10 are coupled to a central diagnostic unit 60. The connection between the sensing system 10 and the central diagnostic unit 60 may be a wired connection or a wireless connection. The two sensing systems 10 can be configured to detect a fault location 62 in the electrical wires 28 between two sensing systems 10. For example, if the output device in the sensing system 10 indicates a red color light, the particular sensing system 10 indicates the approximate location of the fault in the electrical wires 28. In the illustrated embodiment, if the two sensing systems 10 indicate the red color light, the location 62 of the fault is between the two corresponding sensing systems 10. A lookup to the sensor configurations may be necessary to pinpoint the location of the fault. For example, while configuring the sensing systems, the sensor pair information is stored and the distance between the sensing systems is stored in the sensor configurations. When both the sensing systems 10 indicate the red color light, the fault log is referred to determine the location of the fault as distance from one sensing system traversed toward the other sensing system. In certain embodiments, the sensing systems 10 are powered by the central diagnostic unit 60. It should be reiterated herein, the diagnostic system 58 may be compact and lightweight since the each sensing system 10 can have the processing device easily fitted in the sensor housing. Hence, the signal attenuation is reduced and the detection accuracy of the diagnostic system 58 is enhanced.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system comprising:
a sensor housing comprising:
 a base portion;
 a lid portion; and
 a joining portion configured to be wrapped around at least a portion of an electrical wire, wherein the lid portion comprises one end detachably coupled to a first end of the base portion and another end coupled to a second end of the base portion via the joining portion;
a flexible coil sensor disposed in the sensor housing, bonded substantially along the base portion and the joining portion and configured to generate a signal representative of a fault in the electrical wire; and
a processing device disposed in the sensor housing and configured to detect the fault in the electrical wire in response to the signal representative of the fault in the electrical wire generated by the flexible coil sensor.

2. The sensing system of claim 1, wherein the processing device is further configured to detect location of the fault in the electrical wire.

3. The system of claim 1, further comprising an output device provided to the sensor housing and configured to generate an output indicative of presence of the fault in the electrical wire.

4. The system of claim 3, wherein the processing device is coupled to the output device and configured to actuate the output device in response to the signal representative of the fault in the electrical wire generated by the flexible coil sensor.

5. The system of claim 3, wherein the output device comprises one or more light emitting diodes.

6. The system of claim 1, wherein the sensor housing is configured to receive a wire harness comprising the electrical wire.

7. The system of claim 1, wherein the one end of the lid portion is detachably coupled to the first end of the base portion in such a way that the lid portion overlaps the base portion and the flexible coil sensor is surrounded by the lid portion, the joining portion, and the base portion.

8. The system of claim 1, wherein the flexible coil sensor is wrapped around at least a portion of the electrical wire.

9. The system of claim 1, wherein the flexible coil sensor is bonded substantially along a flat surface of the base portion and the joining portion using an adhesive.

10. The system of claim 1, wherein the flexible coil sensor is bonded to at least a portion of the lid portion.

11. The system of claim 1, wherein the processing device comprises an embedded processing chip.

12. The system of claim 1, wherein the processing device has a length in a range of 0.5 inch to 1 inch and a breadth in a range of 0.5 inch to 1 inch.

13. The system of claim 1, further comprising a battery, wherein the sensing system is powered by the battery.

14. A system comprising:
a plurality of sensing systems spaced apart and configured to receive an electrical wire, each sensing system comprising:
a sensor housing comprising a base portion, a lid portion; and a joining portion being wrapped around at least a portion of the electrical wire; wherein the lid portion comprises one end detachably coupled to a first end of the base portion and another end coupled to a second end of the base portion via the joining portion;
a flexible coil sensor disposed in the sensor housing, bonded substantially along the base portion and the joining portion and configured to generate a signal representative of a fault in the electrical wire; and a processing device disposed in the sensor housing and configured to detect the fault in the electrical wire in response to the signal representative of the fault in the electrical wire generated by the flexible coil sensor;

wherein two sensing systems among the plurality of sensing systems are configured to detect a fault location in the electrical wire between two sensing systems.

15. The system of claim 14, further comprising an output device provided to the sensor housing and configured to generate an output indicative of presence of the fault in the electrical wire.

16. The system of claim 14, wherein the processing device is coupled to the output device and configured to actuate the output device in response to the signal representative of the fault in the electrical wire generated by the flexible coil sensor.

17. The system of claim 14, wherein the processing device comprises an embedded processing chip.

18. The system of claim 14, further comprising a central diagnostic unit communicatively coupled to the plurality of sensing systems.

19. The diagnostic system claim 18, wherein each sensing system is powered by the central diagnostic unit.

20. A method comprising:

forming a sensor housing by detachably coupling one end of a lid portion to a first end of a base portion and another end of the lid portion to a second end of the base portion via a joining portion;

disposing a flexible coil sensor in the sensor housing by bonding substantially along the base portion and the joining portion; and disposing a processing device in the sensor housing in such a way so as to sense a signal from the flexible coil sensor; and wrapping the joining portion around at least a portion of the electrical wire.

* * * * *